United States Patent
Karri et al.

(10) Patent No.: US 11,934,162 B2
(45) Date of Patent: Mar. 19, 2024

(54) PROACTIVE BUILDING MAINTENANCE FOR SMART BUILDINGS

(71) Applicant: International Business Machines Corporation, Armonk, NY (US)

(72) Inventors: Venkata Vara Prasad Karri, Visakhapatnam (IN); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 17/223,681

(22) Filed: Apr. 6, 2021

(65) Prior Publication Data

US 2022/0317639 A1 Oct. 6, 2022

(51) Int. Cl.
*G05B 17/02* (2006.01)
*G06F 30/13* (2020.01)
*G06F 30/20* (2020.01)

(52) U.S. Cl.
CPC ............. *G05B 17/02* (2013.01); *G06F 30/13* (2020.01); *G06F 30/20* (2020.01)

(58) Field of Classification Search
CPC G05B 17/02; G05B 2219/2642; G05B 15/02; G06F 30/13; G06F 30/20
See application file for complete search history.

(56) References Cited

U.S. PATENT DOCUMENTS

| | | | | |
|---|---|---|---|---|
| 10,885,238 | B1 * | 1/2021 | Packer | G06F 30/20 |
| 2013/0338970 | A1 * | 12/2013 | Reghetti | G06F 30/13 |
| | | | | 703/1 |
| 2017/0293049 | A1 * | 10/2017 | Frank | G01W 1/12 |
| 2018/0364654 | A1 * | 12/2018 | Locke | G05B 15/02 |
| 2019/0163215 | A1 | 5/2019 | Cheng | |
| 2019/0361407 | A1 | 11/2019 | Vogel | |
| 2022/0076490 | A1 * | 3/2022 | Pearson | G06T 19/20 |
| 2022/0196491 | A1 * | 6/2022 | Dubov | G01L 5/16 |
| 2022/0270190 | A1 * | 8/2022 | Elgethun | G06Q 50/163 |
| 2022/0274019 | A1 * | 9/2022 | Delmonico | A63F 13/5378 |

FOREIGN PATENT DOCUMENTS

| | | |
|---|---|---|
| WO | 2014147148 A3 | 9/2014 |
| WO | 2020018147 A1 | 1/2020 |

OTHER PUBLICATIONS

Anonymous. "Digital Twin." Printed Jan. 20, 2021. 13 pages. Published by GE. https://www.ge.com/digital/applications/digital-twin.

(Continued)

*Primary Examiner* — Chad G Erdman
(74) *Attorney, Agent, or Firm* — Haley J. McClory

(57) ABSTRACT

A processor may receive an input dataset. The input dataset may include a plurality of construction components and one or more performance factors of the building/structure. A processor may generate a digital twin of the building/structure using the input dataset. A processor may simulate, using the digital twin, one or more features of the building/structure. The simulating may include a forecast having one or more predicted conditions associated with the building/structure.

17 Claims, 5 Drawing Sheets

(56) References Cited

OTHER PUBLICATIONS

Anonymous. "Hudhud caused Rs 21,908 crore loss, agri sector worst hit: Andhra Pradesh." Published Dec. 19, 2014. Printed Jan. 20, 2021. 7 pages. Published by The Economic Times. https://economictimes.indiatimes.com/news/politics-and-nation/hudhud-caused-rs-21908-crore-loss-agri-sector-worst-hit-andhra-pradesh/articleshow/45579240.cms.

Anonymous. "Vizag ravaged by Cyclone Hudhud." Published Oct. 18, 2014. Printed Jan. 20, 2021. 14 pages. Published by Wordpress. https://sandeepreddy2019.wordpress.com/tag/damaged-ibm-company-during-cyclone-hudhud-in-vizag/.

Anonymous. "Work safe. Work smart. How IBM TRIRIGA can help." Accessed Jan. 20, 2021. 6 pages. Published by IBM. https://www.ibm.com/products/tririga.

Janyala, S., "Cyclone Hudhud: Visakhapatnam IT park in a bad shape." Published Oct. 15, 2014. Printed Jan. 20, 2021. 12 pages. Published by The Indian Express. https://indianexpress.com/article/india/india-others/cyclone-hudhud-visakhapatnam-it-park-in-ruins/.

Marr, B., "What Is Digital Twin Technology—And Why Is It So Important?" Published Mar. 6, 2017. 4 pages. Published by Forbes. https://www.forbes.com/sites/bernardmarr/2017/03/06/what-is-digital-twin-technology-and-why-is-it-so-important/?sh=29147bd32e2a.

Mell, et al., "The NIST Definition of Cloud Computing," Recommendations of the National Institute of Standards and Technology, U.S. Department of Commerce, Special Publication 800-145, Sep. 2011, 7 pgs.

Shaw, et al., "What is a digital twin and why it's important to IoT." Published Jan. 31, 2019. 5 pages. Published by NetworkWorld. https://www.networkworld.com/article/3280225/what-is-digital-twin-technology-and-why-it-matters.html.

\* cited by examiner

PROACTIVE BUILDING MAINTENANCE FOR SMART BUILDINGS

BACKGROUND

The present disclosure relates generally to the field of building management, and more particularly to identifying conditions or potential damage associated with a building.

Often, buildings that are not actively maintained or managed can become derelict or inhabitable. One significant contributing factor to building damage is the weather. Every day some part of the world likely experiences severe weather that results in building damage. As such, buildings need to be continuously maintained to combat potential weather damage.

SUMMARY

Embodiments of the present disclosure include a method, computer program product, and system for proactive building maintenance. A processor may receive an input dataset. The input dataset may include a plurality of construction components and one or more performance factors of the building. A processor may generate a digital twin of the building using the input dataset. A processor may simulate, using the digital twin, an impact of one or more weather conditions on the building. The simulating may include a forecast having one or more predicted conditions associated with the building.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
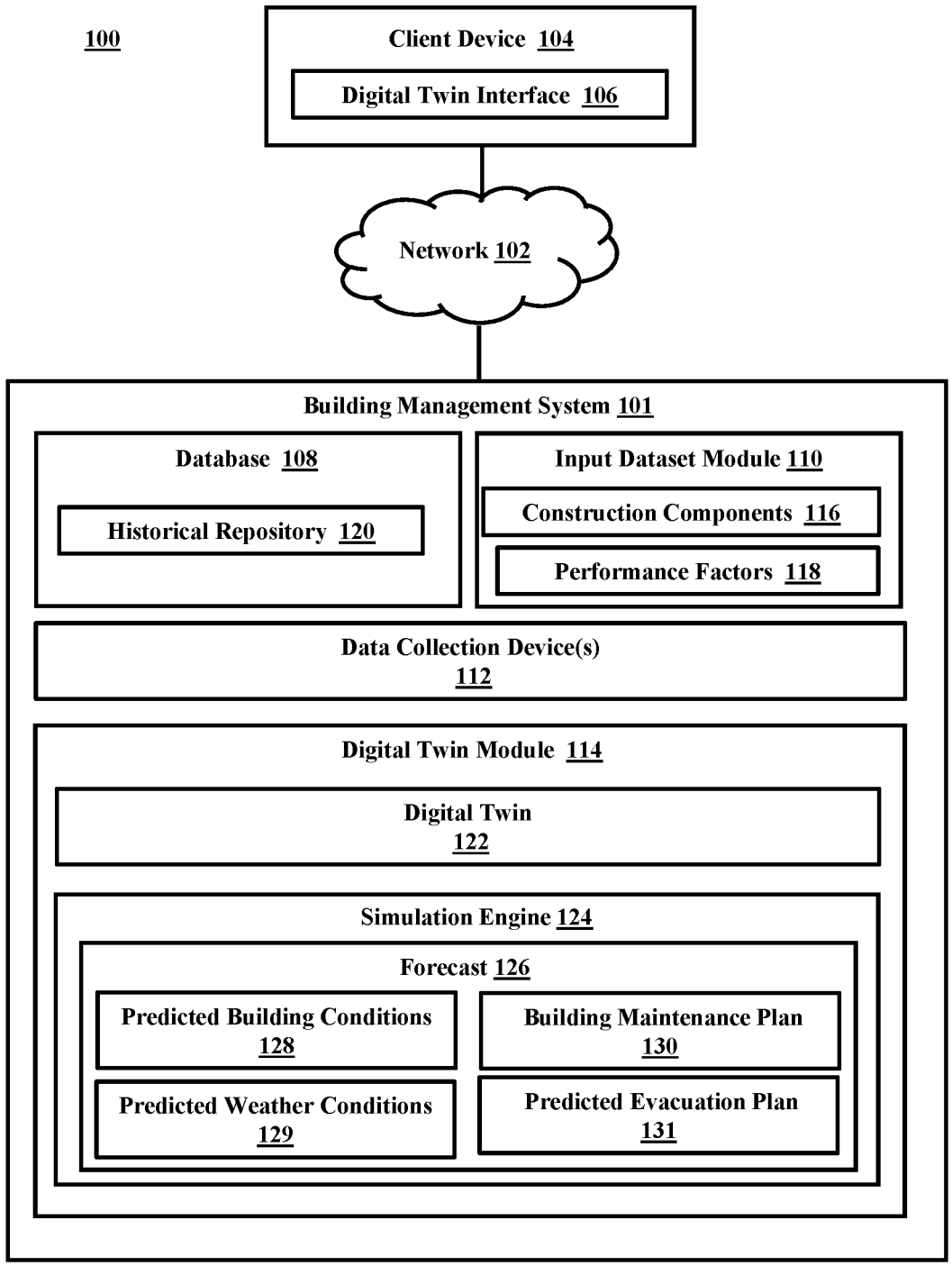
FIG. 1 depicts a block diagram of an embodiment of a computing environment for generating, modeling, and/or simulating a digital twin in accordance with the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of building management, and more particularly to identifying conditions or potential damage associated with a building by using digital twin technology to form predictive weather conditions. While the present disclosure is not necessarily limited to such applications, various aspects of the disclosure may be appreciated through a discussion of several examples using this context.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be readily understood that the instant components, as generally described and illustrated in the figures herein, may be arranged and designed in a wide variety of different configurations. Accordingly, the following detailed description of the embodiments of at least one of a method, apparatus, non-transitory computer readable medium and system, as represented in the attached figures, is not intended to limit the scope of the application as claimed but is merely representative of selected embodiments.

The instant features, structures, or characteristics as described throughout this specification may be combined or removed in any suitable manner in one or more embodiments. For example, the usage of the phrases "example embodiments," "some embodiments," or other similar language, throughout this specification refers to the fact that a particular feature, structure, or characteristic described in connection with the embodiment may be included in at least one embodiment. Accordingly, appearances of the phrases "example embodiments," "in some embodiments," "in other embodiments," or other similar language, throughout this specification do not necessarily all refer to the same group of embodiments, and the described features, structures, or characteristics may be combined or removed in any suitable manner in one or more embodiments. Further, in the FIGS., any connection between elements can permit one-way and/or two-way communication even if the depicted connection is a one-way or two-way arrow. Also, any device depicted in the drawings can be a different device. For example, if a mobile device is shown sending information, a wired device could also be used to send the information.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application and to enable others of ordinary skill in the art to understand the disclosure for various embodiments with various modifications as are suited to the particular use contemplated.

Buildings play an obvious key role in people's day to day lives by offering shelter from the outside weather conditions. However, in some situations, different weather conditions can cause significant damage to area buildings. In some situations, weather conditions can be severe enough to affect the integrity of the building and create a dangerous situation for people housed within the building. While accuracy in weather forecasting has improved, the severity of a storm or weather condition and resulting impact on a building or shelter can be difficult to predict. Often, weather conditions and/or the severity of the weather condition can be difficult to predict, leaving people unable to proactively determine what can be done to minimize potential building damage. Because of this difficulty, a building's integrity and how the building may be impacted during sever weather conditions is often unknown. Furthermore, people housed within the building during severe weather may be negatively impacted if the severity of weather conditions result in a negative impact to the building.

As such, the present disclosure provides embodiments associated with managing and simulating a building/structure that reduces water waste, potential damage to the building/structure, and to the environment surrounding the building/structure. In embodiments, an artificial intelligence enabled digital twin simulation engine is generated to simulate a building/structure. A digital twin can simulate a particular building/structure and take into consideration various factors and conditions of the building/structure including, but not limited to, the water quality, pattern of scaling, rusting, blockages or jams in the valves or pipes, and weakening in one or more of the plurality of building/structure components. In addition, the digital twin simulation engine can also simulate how the water might be contaminated at different stages of water flow at a particular water access point, and how the contaminated water can be reused for a different purpose.

A building management system, such as that/those discussed herein, can also be employed for other uses, (e.g., first responders can receive relevant information about the building and people in the building. Such systems could also monitor the building/structure's surrounding environment (e.g., soil hardness, bodies of water etc.). Because of these different properties and configurations, each building/structure can incur different types of damages. In these building/structures, often where the damage has occurred and remedying the damage is difficult to detect and is often not detected until the building/structure fails in some way (e.g., water does not arrive at expected access point). As such, a method of preventing building/structure breakdown is needed.

The following disclosure provides various embodiments for a building management system that can leverage the use of digital twin technology to improve the management of buildings, particularly in regard to how weather conditions may impact the building. In embodiments, an input dataset comprising data associated with the building system is received by a processor. The input dataset can include information about the plurality of components (e.g., materials associated with the building structure, water system electrical system, etc.) that make up the composition of the building/structure and one or more performance factors (environmental factors, material parameters, etc.). In embodiments, a digital twin of the building/structure is generated using the input dataset. The digital twin of the building/structure can simulate one or more features of the building/structure and generate a forecast having one or more predicted conditions associated with the building/structure.

A forecast may include, but is not limited to, one or more recommended actions, one or more recommended building maintenance plans, and in response to identifying one or more predicted conditions, recommending repairs to the building/structure, recommended maintenance schedules (e.g., when inhabitants/users/people using the building will be least affected), operating conditions or performance factors associated with the particular condition, and further recommendations for improving the overall health and longevity of the building/structure during various modes of operation or working conditions. Using digital twin technology can address the various other problems associated with traditional building/structures, while also improving space and facility utilization, optimize accounting associated with building/structures, and scale enterprises that utilize building/structures.

Turning now to the figures, FIG. 1 depicts a computing environment 100, in accordance with embodiments of the present disclosure. In embodiments, building management system 101 leverages the use of digital twin technology to effectively manage a building subjected to one or more weather conditions. FIG. 1 provides an illustration of only one embodiment and does not imply any limitations with regard to the environments in which different embodiments may be implemented. Many modifications to the depicted environment may be made by those skilled in the art without departing from the scope of the invention as recited by the claims.

Computing environment 100 can include network 102, client device 104, and building management system 101 (e.g., a system) for managing a building exposed to one or more weather conditions. Building management system 101 can be implemented as an application running on a user's computing device (e.g., client device 104), as a service offered via the cloud, as a web browser plugin, as a smartphone application, or as a codependent application attached to a secondary application (e.g., as an "overlay" or a companion application to a partner application, such as text messaging application).

Network 102 can be any type or combination of networks. For example, network 102 can include any combination of personal area network (PAN), local area network (LAN), metropolitan area network (MAN), wide area network (WAN), wireless local area network (WLAN), storage area network (SAN), enterprise private network (EPN), or virtual private network (VPN). Network 102 can refer to an IP network, and may include one or more wired and/or wireless networks that are capable of receiving and transmitting data, voice, and/or video signals, including multimedia signals that include voice, data, and video information. For example, database 106 can communicate with various client devices 104 (e.g. tablets, laptops, smartphones, portable terminals, conferencing device components, client device 104, etc.) over the Internet.

In some embodiments, network 102 can be implemented within a cloud computing environment, or using one or more cloud computing services. Consistent with various embodiments, a cloud computing environment can include a network-based, distributed data processing system that provides one or more cloud computing services. Further, a cloud computing environment can include many computers (e.g., hundreds or thousands of computers or more) disposed within one or more data centers and configured to share resources over network 102. Cloud computing is discussed in greater detail in regard to FIGS. 3A and 3B.

Client device 104 can be a laptop computer, tablet computer, smartphone, smartwatch, or any other computing device that allows for a client/user to interact with and execute the methods and/or techniques described herein. In various embodiments, client device 104 can provide a client/ user with information and/or one or more findings identified by building management system 101 via digital twin interface 106 (e.g., evacuation information). In some embodiments, digital twin interface 106 can provide an interface between client device(s) 104 and building management system 101.

Digital twin interface 106 can be a graphical user interface (GUI), a web user interface (WUI) or any other suitable interface for a user to interact with and execute the methods and/or techniques described herein. As described herein, this information can be provided to a client/user in any format. For example, information can be relayed to a client/user via client device 104 via video, audio, images, and or text (e.g., charts, weather condition readings, or building parameter readings) that is transmitted, communicated, or otherwise provided by building management system 101. Client device 104 can represent any programmable electronic devices or combination of programmable electronic devices, capable of executing machine readable program instructions and as well as capable of communicating with other computing devices (not shown) within computing environment 100 via network 102. Furthermore, client device 104 can comprise a plurality of devices, both stationary and portable, that enable a user to be mobile.

Building management system 101 can be a standalone computing system, a server, and/or a virtualized system running on one or more servers within a cloud networking environment capable leveraging digital twin technology to manage a building/structure. Building management system 101 can include database 108, input dataset 110, data collection device(s) 112, and digital twin module 114. The term "module" may refer to a hardware module, software module, or a module may be a combination of hardware and software resources. Embodiments of hardware-based modules may include self-contained components such as chipsets, specialized circuitry, one or more memory devices and/or persistent storage (see FIG. 4). A software-based module may be part of a program (e.g., programs 428, FIG. 4), program code or linked to program code containing specifically programmed instructions loaded into a memory device or persistent storage device of one a data processing systems operating as part of the computing environment 100. For example, data associated with digital twin module 114, depicted in FIG. 1, can be loaded into memory or a database, such as database 108.

In embodiments, client device 104 can be a component of building management system 101. In these embodiments, client device 104 can include all of the components, or fewer than all the components necessary to implement building management system 101. For example, input dataset module 110, can be configured on client device 104 while digital twin module 114 can be configured on a separate device.

In embodiments, building management system 101 can include database 108, input dataset module 110, data collection device(s) 112, and digital twin module 114. Building management system 101 can be configured to manage any type of building or structure that can be affected by weather conditions. These building/structures can include, but are not limited to, any configuration apartments or apartment buildings, houses, residential block, industrial use buildings, commercial buildings, or any combination thereof. In some embodiments, the building could be a museum or an important tourist attraction (e.g., Statue of Liberty or Washington Monument) where maintaining internal (e.g., inhabitants and/or works of art) and external components (e.g., construction components) is important to the public. The building/structure managed by building management system 101 can be a physical building/structure that is already built (e.g., a constructed house) or can also be a proposed design (e.g., a blueprint of the building/structure).

In embodiments, database 108 can be configured to store a wide variety of information and different data types, as contemplated herein. While in some embodiments database 108 is a single database configured to maintain one or more libraries of information and historical repository 120, in other embodiments, historical repository 120 is separately situated from database 108. In embodiments, database 108 can include one or more libraries of data including, but not limited to, building standards, data associated with building conditions, data associated with environmental conditions of the building, or any other data necessary to manage a building/structure, as contemplated herein. Such data can be accessed from database 108 by building management system 101, or individually by input dataset module 110 and/or digital twin module 114, as needed. Database 108 may be configured to store data in various formats including, but not limited to audio and video recordings, readings, images, repositories of system data (e.g., client preferences), and/or any other data format type that can be capable of storing relevant building/structure data used by building management system 101. In embodiments, database 108 can reside on a single server, on multiple servers within a cloud computing environment, on client system 104 and/or on the same physical system or virtualized system as building management system 101.

In embodiments, building management system 101 can include historical repository 120. In some embodiments, historical repository 120 can be independently situated from other components in building management system 101, while in other embodiments, historical repository 120 can be a component of, database 108, digital twin module 118, input dataset module 110, or any combination thereof. In embodiments, building management system 101 can configure historical repository 120 to receive and store information or data analyzed or determined from a particular building or structure managed by building management system 101.

In embodiments, building management system 101 is configured to receive one or more input datasets via input dataset module 110. Input dataset module 110 can provide building management system 101 with information and data (e.g., input dataset) about one or more particular buildings or structures to be managed by the system. In embodiments, input dataset module 110 can be configured to receive one or more building system documents or digital files. In these embodiments, input dataset module 110 can be configured to convert the documents or digital files into one or more input datasets having plurality of construction components 116 and/or one or more performance factors 118. Input datasets, derived from documents or digital files, can be used to infer how a particular building or structure would be constructed (e.g., using construction components 116) and perform (e.g., performance factors 118) if the design was implemented in real-life.

In embodiments, plurality of construction components 116 can include any material used to construct buildings/structures. These materials can include, but are not limited to, materials associated with wall construction (e.g., cement, wood, nails, screws, etc.), windows, electrical system components, water system components, heating and/or air conditioning components, and any other utility that might be incorporated into a building. In some embodiments, construction components 116 can further include how each component is configured and/or data information associated particular construction components. For example, plurality construction components 116 can include information and data not only associated with a particular building design (e.g., building having a particular electrical system), but also data regarding various brands of construction components, possible material of the particular building component, and one or more performance parameters. Performance parameters can include any relevant information associated with the specific construction components 116. For example, a waterpipe system of a building might have a particular brand or type of pipe. In this example, a performance parameter of the particular pipe could include information such as, crack growth resistance, environmental stress crack resistance, tensile and compressive strength, minimum and maximum pressure limits, pipe diameter, and pipe wall thickness. In some embodiments, input dataset can provide partial information that can be linked to additional data or information stored in database 108. For example, input dataset module 110 can identify a particular material (e.g., type of wood) used as a building component 116 to construct a building or structure, from the input dataset, and retrieve relevant data or performance parameters (e.g., amount of pressure a particular window can withstand) associated with that particular brand of particular window stored in database 108.

In embodiments, performance factors 118 can include one or more factors that influence how the building/structure functions and performs during different weather conditions. More particularly, performance factors 118 can provide information and data regarding how weather conditions may influence or impact one or more of the plurality of construction components 116 and can include any factor that affects the operation and use of the building/structure. Performance factors 118 can include such factors including, but not limited to, the type of windows used (e.g., noise suppression, breakability, water resistance, etc.) in the building, durability or structure of the walls (e.g., spacing of building frame, thickness of walls), how the building/structure is oriented in a particular location (e.g., prone to flooding). While in some embodiments performance factors 118 are configured from the technical specifications of the particular component (e.g., technical specification states a particular window type can only maintain a pressure below a specific level), in other embodiments, performance factors 118 may also include actual data observed by building management system 100.

In embodiments where one or more of the plurality of construction components 116 are not definitively identified from the documents or digital files (e.g., input dataset) or performance factors 118 are not provided in either the documents or database 108, building management system 101 can be configured to determine what the missing construction components 116 or performance factors 118 are. In some embodiments, building management system 101 can identify that one or more of the plurality of construction components 116 or one or more performance factors 118 are missing and send a message to client device 104 indicating that the information is not available.

In these embodiments, building management system 101 can, using various methods contemplated herein: i) request a client/user to input information or data associated with the missing construction component or missing performance factor; ii) make a recommendation on what the one or more missing construction components or performance factor should be (e.g., use machine learning to extrapolate a similar waterpipe component or performance factor, based, at least in part, on the information and data from input dataset module 110 and database 108 and/or historical repository 120); iii) automatically select the most likely construction component or performance factor that would fulfill the missing construction component or performance factor role; or iv) any combination thereof.

In embodiments, input dataset module 110 can be configured to receive information and data (e.g., plurality of construction components 116 and/or performance factors 118) regarding a particular building/structure and how the building/structure performs via one or more data collection devices 112. In some embodiments, data collection device(s) 112 can be connected or coupled to, or in close proximity to, one or more of the plurality of construction components 116 that make up the building or structure. The one or more data collection devices 112 can be coupled to any internal or external construction component, such as doors, windows, walls, at various points in the electrical system, at various points in the building/structure or any other component that could be impacted during different weather conditions. Data collection device(s) 112 can include, but are not limited to, one or more sensors, IoT (Internet of Things) devices, and recording systems configured to capture performance factors 118 associated with a particular building/structure. In these embodiments, building management system 101 can configure one or more data collection devices 112 to identify one or more of the plurality of construction components 116 and/or performance factors 118 of the building/structure to provide a real-time data feed.

In embodiments, building management system 101 can configure data collection devices 112 to provide, not only a real-time feed of the status of the building/structure, but can also provide data and information (e.g., performance factors 118) regarding conditions surrounding one or more of the plurality of construction components 116 of the building/structure (e.g., internal temperature of the building). As discussed herein, performance factors 118 can include any element/factor that is capable of affecting how the building/structure functions, particularly as it relates to withstanding weather conditions. Input dataset module 110 can be configured to receive information and data collected from data collection device(s) and identify one or more performance factors 118 that affect a particular building/structure in real-time.

These performance factors 118 can include, but are not limited to: i) actual condition of construction component 116 (e.g., roof leaking, weakening of building structure, damage to the building, etc.); ii) data readings of one or more construction components 116 under different weather conditions (e.g., how the structure is affected by hurricane scale winds); iii) real-time data associated with operational utilities (e.g., water systems and electrical system) and where the utilities are being utilized within the building/structure.

In some embodiments, data collection device(s) 112 can provide input dataset module 110, with sufficient data (e.g., one or more input datasets) to define the plurality of construction components 116 and performance factors 118 associated with the building/structure of interest. In other embodiments, input dataset module 110 can configure the data and information collected by one or more data collection device(s) 112 and combine it with a document or digital file of the building/structure (e.g., blueprint or design model of building/structure) to define the plurality of construction components 116 and performance factors 118 associated with the building/structure of interest. In embodiments, digital twin module 114 can be configured to receive construction components 116 and performance factors 118 from input dataset module 110 associated with the building/structure. In embodiments, digital twin module 114 can generate digital twin 122 and simulate one or more features of a particular building/structure under one or more weather conditions to provide a client/user with a forecast 126. Forecast 126 can allow the client/user to determine how one or more features of the particular building/structure would be impacted if the building/structure were subjected to the one or more weather conditions in real life.

In some embodiments, building management system 101 can be configured to receive information and data regarding the structure design/configuration of the building during construction. In these embodiments, IoT sensors, imaging technology, and various scanning method (e.g., via data collection devices 112) may be used to determine how the building was constructed. In some embodiments where construction of a building/structure is already completed, ultrasound and x-ray technology may be implemented to identify how the building was constructed. Such devices and methods can be configured to identify different construction components 116 and performance factors 118.

While in some embodiments, building management system 101 can configure one or more data collection devices 112 to provide a "snapshot" depicting the state of the building/structure at a particular instance, in other embodiments, building management system 101 can configure one or more data collection devices 112 to provide a more comprehensive surveillance of the building/structure. In embodiments, building management system 101 can configure one or more data collection devices 112 to: i) constantly survey the building/structure and relay the information and data to building management system 101; ii) intermittently survey the building/structure (e.g., survey at particular timed intervals); iii) data collection device(s) 112 can be configured to relay information only when there is information indicating a significant change in one or more construction components 116 or performance factors 118 of the building/structure; or any combination thereof. Building management system 101 can configure one or more data collection devices 112 to collect and store this observed or historical data in historical repository 120. In embodiments, the historical data stored in historical repository 120 can be used by input dataset module 110 to define the building/structure's configuration, and/or by digital twin module 114 to generate digital twin 122 and enable building management system 101 to simulate digital twin 122 and generate forecast 126 using simulation engine 124.

In embodiments, building management system 101 can use the historical data stored in historical repository 120, to produce predicted conditions of one or more features of the building/structure. In embodiments, building management system 101 can configure the historical data stored in historical repository 120 to identify one or more observed performance factors in the building/structure that can indicate a potential change in one or more of the plurality of construction components 116 and/or other performance factors 118. For example, one or more data collection devices 112 over a period of time can observe changes to the building/structure as a result of time and/or weather conditions and detect how the occurrence of the particular weather conditions can then affect other performance factors 118. In embodiments, building management system 101 can discern, using statistical modeling, deep learning models, machine learning models, or a combination thereof, if and how a particular performance factor 118 will influence one or more construction components 116 and/or other related performance factors 118 of the building/structure (e.g., how damage to one side of the building results in other additional construction components 116 being impacted).

In embodiments, building management system 101 can use the aforementioned techniques to identify historical patterns from the historical data collected by one or more data collection devices 112 and stored in historical repository 120. An historical pattern can include, but is not limited to, identifying one or more particular performance factors 118 observed from one or more data collection devices 112 that causes a particular condition to one or more construction components 116 in the building/structure, determining the effect of a particular performance factor 118 on one or more construction components 116 over a particular period of time, determining the time period associated with the worsening (or improving) condition of the construction components 116, and determining how an observed performance factor impacts the use and operation of the building/structure. For example, how damage to one side of the building can cause the integrity and safety of the building to be diminished. Building management system 101 can use the various techniques contemplated herein (e.g., machine learning) and information stored in historical repository 120 to identify an historical pattern associated with the repercussions of different weather conditions.

In embodiments, building management system 101 can be configured to manage and observe more than one particular building. In such embodiments, historical repository 120 can be configured to store information and data associated with each building/structure. While in some embodiments, historical patterns for a particular building/structure are determined from the historical data observed/collected only from that particular building/structure, in other embodiments, building management system 101 can configure historical repository 120 to identify historical patterns associated with historical data observed/collected from all building/structure managed by building management system 101.

In embodiments, building management system 101 can be configured to generate a digital twin 122 of a particular building/structure using digital twin module 114. Digital twin module 114 can further include simulation engine 124. In embodiments, digital twin module 114 can be configured to receive one or more input datasets form input dataset module 110 associated with the particular building/structure of interest to generate one or more digital twins 122. While commonly known in the art, digital twins, such as digital twin 122, are generated using various artificial intelligence techniques to create a digital representation that mimics the structure and performance of a particular building/structure of interest. Using digital twin 122 of a particular building/structure, one or more features of the building/structure can be simulated by simulation engine 124.

In embodiments, building management system 101 can provide digital twin services via digital twin module 114 to clients/users connecting and assessing digital twin module 114 via client device 104. In these embodiments, the digital twin services and/or access may be provided to owners, purchasers, licensees, manufacturers, sellers, licensors, and other authorized individuals (collectively referred to herein as "client/users") of the digital twins being accessed. Embodiments of building management system 101 may execute program code of digital twin module 114, including, but not limited to, i) retrieving and creating digital twin 122 models; ii) aggregating, organizing, and storing data generated by data collection device(s) 112 (e.g., sensor devices, IoT devices, and or recording systems) associated with the building/structure of interest; and iii) monitoring changes in the operating conditions of the building/structure, including operation and changes associated with of plurality of construction components 116 (e.g., pipes, valves, pumps etc.)

and performance factors 118 of the building/structure of interest as reflected by the digital twin.

In embodiments, building management system 101 can configure digital twin module 114 to simulate digital twin 122 using simulation engine 124. In these embodiments, simulation engine 124 can simulate the impact of one or more weather conditions on the building/structure (e.g., digital twin of the building/structure) to generate a forecast. In these embodiments, one or more features can refer to any element of the building/structure that is of interest to a client/user impacted by one or more weather conditions. Building management system 101 can determine how one or more features (e.g., particular construction components 116 and/or particular performance factors 118) of a building/structure are influenced when a particular stimuli or change is applied to the building/structure by applying a simulation (e.g., via simulation engine 124) of the stimuli to the digital twin 122 of the building/structure. Examples of simulated features include, but are not limited to, how one or more features (e.g., construction components 116 and performance factors 118) system performs at particular temperatures, how the building/structure performs over a particular time duration, if some portion the water contained within the building/structure has contaminants, what the contaminants in the building/structure are, and if the type and/or amount of water contaminants limit the use of that particular portion of water. In one example embodiments, digital twin module 114 via simulation engine 124 may determine if water is likely to accumulate in or around the building/structure (e.g., via a waterpipe bursting or flooding). In this example embodiment, digital twin module 114 can determine one or more conditions of the accumulated water. These one or more conditions of the accumulated water may include, but are not limited to likelihood of water contamination, what contaminants may be in the water, and/or if the water is likely to breed insects, such as disease spreading mosquitoes.

In embodiments, simulation engine 124 can be configured to receive historical data and historical patterns stored in historical repository 120 to generate forecast 126 having one or more predicted building conditions 128, building maintenance plans 130, predicted weather conditions 129, predicted evacuation plans 131 or any combination thereof. Forecast 126 can send reports associated with simulation results to clients/users that can include proposed actions to the clients/users.

In some embodiments, forecast 126 via simulation engine 124 may provide one or more predicted building conditions 128 associated with the one or more predicted weather conditions 129. In embodiments, forecast 126 may further provide a client/user with a description of parameters considered by simulation engine 124 while simulating the digital twin 122 of the building/structure to produce forecast 126. A client/user may review each of the forecasts associated with a building of interest comprising, one or more predicted building conditions 128, one or more predicted weather conditions, one or more predicted evacuation plans 131, building maintenance plans 130 and select one or more actions (e.g., schedule maintenance) or any combination thereof.

In embodiments, forecast 126 can further include one or more accuracy indicators, determined by digital twin module 114, indicating the accuracy of forecast 126 (e.g., using calculation of percent error). In some embodiments, while a high accuracy indicator can imply that some or all of the data used by digital twin module 114 to generate the one or more digital twins 122 and simulate the one or more forecast 126 is known or well understood, a low accuracy indicator can imply that some portion of relevant data associated with the building/structure of interest is omitted. In these embodiments relevant data can include, but is not limited to, any data associated with input dataset module 110, database 108, historical repository 120, data collection device(s) 112, or digital twin module 114, that is used to define the building/structure of interest.

Relevant data can be omitted by digital twin module 114 for a variety of reasons including, but not limited to, determining that the relevant data is missing or unavailable within building management system 101 and/or determining the relevant data collected (e.g., from a broken data collection device 112) is, more likely than not, inaccurate. For example, one or more data collection devices 112 could be faulty (e.g., damaged by the environment) and provide building management system 101 with incorrect information. In these embodiments, building management system 101 may independently determine or receive an indication (e.g., via message from a data collection device 112 having a built-in self-test) that one or more of data collection devices 112 is defective/broken and the data, if any data is received, should be disregarded or omitted.

In other embodiments, building management system 101 can receive a data reading from one or more data collection devices 112 and determine that the data is inaccurate by comparing the data reading to the other data readings received by neighboring data collection devices 112 or by comparing the data reading to data readings collected and stored in historical repository 120. In these embodiments, building management system 101 can use techniques contemplated herein (e.g., machine learning) to identify whether the data reading is likely inaccurate and should be omitted or if the data reading is indicative of a particular condition of one or more of the plurality of construction components 116 or change in one or more performance factors 118.

In embodiments, where relevant data is omitted from digital twin module 114 with the building of interest, building management system 101 can utilize information from various libraries housed within database 108, historical repository 120, and one or more data collection device(s) 112 (e.g., a neighboring data collection device 112 proximate to the faulty data collection device 112) to fill in the missing data. In embodiments, where some portion of the data necessary to generate one or more digital twins 122 and/or to perform the simulation via simulation engine 124 is omitted, building management system 101 can configure digital twin module 114 to make intelligent extrapolations based on the data available to make assumptions on the data missing. Depending on the data used to make the intelligent extrapolations, digital twin module 114 can assign a reliability score to the data used.

For example, data associated with a particular building/structure stored historical repository 120 could have a high reliability score when used to fill in omitted data/information needed to generate/simulate digital twin 122, while data from database 108, that could generically apply to many different buildings, could have a lower reliability score. In embodiments, the various reliability scores used by digital twin module 114 can be accumulated to generate the one or more accuracy indicators. As discussed herein, the accuracy indicators can provide a confidence level to a client/user regarding how accurate the forecast 126 is and if the one or more predicted building conditions 128 provided are more likely than not to occur in the actual building/structure. In embodiments where forecast 126 is based on historical repository 120 (e.g., and the data collected from the building/structure via data collection devices 112), as more data is collected over time digital twin module 114 and more particularly, simulation engine 124 can generate more accurate digital twins 122 and forecasts 126 as a result of having more data available associated with the particular building/structure.

In embodiments, forecast 126 can include one or more predicted building conditions 128 associated with how one or more of the plurality of construction components 116 may be affected or impacted by a particular weather condition. In embodiments, digital twin module 114 uses historical data, data received from data collection devices 112, data received from weather organizations, or any combination thereof, to simulate a particular weather condition. This information can include, but is not limited to, the type of weather condition (e.g., heatwave, hurricane, flooding, etc.), the severity of the weather condition, and the possible duration of the weather change. For example, if a hurricane is expected to make landfall near a building of interest, digital twin module 114 can use the aforementioned information to simulate the expected features of the particular weather condition (e.g., speed and amount of rainfall, wind speeds, wind thrown debris, thunder and lightning, poor visibility, etc.).

In embodiments, the forecast 126 generated by digital twin module 114 and configured by building management system 101 may include a predicted evacuation plan. In these embodiments, digital twin module 114 can simulate and determine the impact of the one or more predicted building conditions 128 associated with the one or more predicted weather conditions 129 that may negatively affect any inhabitants (e.g., employees working in an office building) or objects considered important by the user (e.g., equipment or valuable artwork). As contemplated herein, damage to a building can reduce integrity/stability of the structure and/or make it uninhabitable. Such damage can result in damage to the building's internal structures and objects creating safety concerns for current occupants of the building. As such, predictive evacuation plans 131 can be provided plans that reduce potential damages to occupants (e.g., people and/or animals) as well as objects of importance.

In some embodiments, building management system 101 can be configured to receive inhabitant data regarding one or more occupants of the building/structure. Inhabitant data may be collected by one or more of the data collection devices 112 (e.g., biometric tracking devices and other data collection devices as contemplated herein) and stored in historical repository 120 to be used while generating predicted evacuation plan 131. In some embodiments, inhabitant data is an accounting of the location and/or number of people in the building. Such data could be used by first responders to determine whether the building should be searched for people sheltering in place during a storm. In some embodiments, building management system 101 can be configured to send inhabitant data to first responders to ensure help is received by the people sheltering in the building.

In embodiments, digital twin module 114 may use inhabitant data to simulate particular digital twins of the inhabitants inside the building and determine how the inhabitants might be impacted at particular areas of the building based on the predicted weather condition 129. In some embodiments, building inhabitants may opt-in to building management system 101. In these embodiments digital twin module 114 may be configured to produce digital twins of those inhabitants that have opted into building management system 101. The digital twins of the one or more inhabitants may reflect the real-time health condition of the particular inhabitant to determine what the inhabitants' vulnerabilities are and what might be affecting or impacting the inhabitant at a particular time during the weather condition (e.g., a severe thunderstorm could affect noise-sensitive people and increase anxiety). In some embodiments, inhabitant data can be collected from optionally disclosed medical history. For example, if an inhabitant has a medical condition that makes them more vulnerable during a particular weather conditions (e.g., heatwaves) digital twin module 114 could simulate the digital twin of the vulnerable inhabitant and generate a predicted evacuation plan 131 for the vulnerable inhabitant to ensure they are not negatively affected by the weather condition's effect on the building (e.g., electricity blackout during a heatwave could result in a loss of air conditioning utilities).

In embodiments, digital twin module 114 may generate a forecast 126 having more than one kind of predicted evacuation plan 131. Predicted evacuation plans 131 can include selective evacuation plans and full evacuation plans. For example, in embodiments where the generated forecast 126 predicts the building may become unsafe due to damage or impacts caused by the weather condition, building management system 101 can generate a full evacuation plan that ensures all occupants of the building safely vacate the building. Full evacuation plans may include one general plan for all building occupants or, using inhabitant data can personalize the evacuation plan depending on the location and needs of the particular occupant/inhabitant in the building.

In embodiments where forecast 126 includes selective evacuation plans in predictive evacuation plan 131, only some of the occupants/inhabitants may be asked to vacate the building. In some embodiments, digital twin module 114 may simulate an occupant's digital twin using inhabitant data to determine that one or more inhabitants may be disproportionately affected by the weather condition due to a medical condition when compared to the remaining inhabitants/occupants. As a result, forecast 126 may include a selective evacuation plan that recommends the inhabitants disproportionately affected by the weather condition (e.g., if a person has a mobility issue) should evacuate the building while also recommending that the unaffected population of inhabitants are safe and should remain in the building. In some embodiments, digital twin module 114 may also generate predicted evacuation plans 131 where the selective evacuation plan includes recommending people evacuate the area of the building they are in and direct them to a safer area of the building depending on the particular location of the inhabitant. In one example embodiment, if building management system 101 (via digital twin module 114) determines that a tornado is directed toward a particular building having five floors, building management system 101 could determine that the best evacuation plan based on available evacuation time for people on the $5^{th}$ floor would be to evacuate and shelter in the stairwell while people on the first floor to shelter in the building's basement.

In embodiments, the forecast 126 generated by digital twin module 114 and configured by building management system 101 can recommend a building reconfiguration or new/updated building design to mitigate the one or more predicted building conditions 128 associated with the building/structure. In these embodiments, digital twin module 114, input dataset module 110, data collection devices 112, and historical repository 120 can be configured to simulate the generated digital twin 122 to produce forecast 126 with one or more predicted building conditions 128 and building maintenance plan 130. In these embodiments, forecast 126 can identify a condition of the one or more plurality of construction components 116 and/or performance factors that are affecting the building/structure (e.g., predicted building condition 128). Simulation engine 124 may generate a building maintenance plan 130 which can include recommendations on how the building can be altered to prevent or mitigate the one or more predicted conditions from occurring during one or more particular weather conditions, and/or how the building design/configuration can be improved upon to reduce weather related damage and potential building failures. For example, during a hurricane, a building having multiple sides may have one side significantly damaged by the direction and speed of the hurricane winds, while the other similarly constructed sides of the building have minimal or no damage. In this example, simulation engine 124 could simulate using weather forecast data to generate forecast 126 to have a building maintenance plan 130. In this example, the forecast including building maintenance plan 130 could be sent to the user (e.g., building owner) before the hurricane is expected. In such embodiments, the building maintenance plan 130 may include the expected damages, the specific mitigation factors that must be taken to reduce or prevent the expected damages, what damages might occur despite performing additional building maintenance and following the specified mitigation factors.

Figure 2:
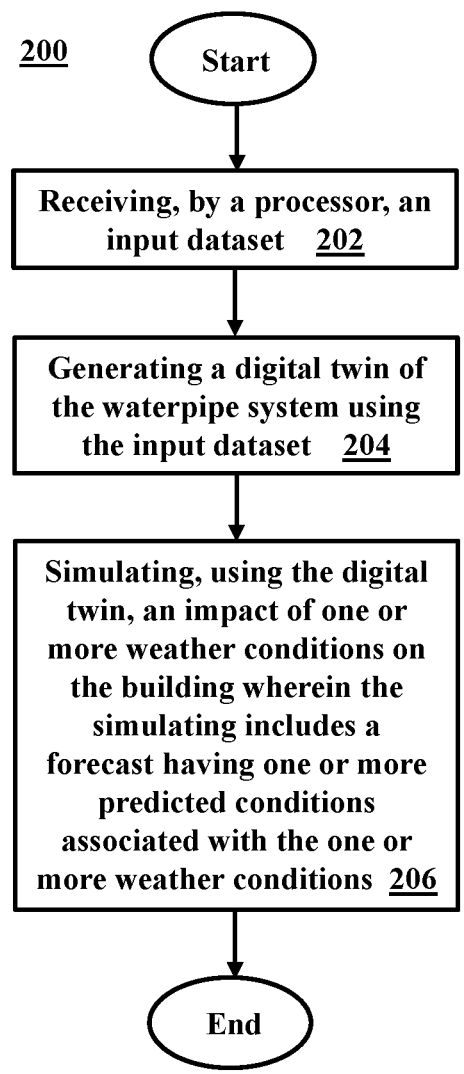
FIG. 2 illustrates a flowchart of a method for managing a building, in accordance with embodiments of the present disclosure.

Referring now to FIG. 2, a flowchart illustrating an example method 200 for management a building/structure, in accordance with embodiments of the present disclosure. In some embodiments, the method 200 may be performed by building management system 101, as referenced in FIG. 1.

In some embodiments, the method 200 begins at operation 202 where the processor receives an input dataset having a plurality of construction components and performance factors. The method 200 proceeds to operation 204 where the processor generates a digital twin of the building/structure of interest using, at least in part, the input dataset. The method 200 proceeds to operation 206 where the processor simulates, using the digital twin, an impact of one or more weather conditions on the building. In embodiments the simulation can include a forecast having one or more predicted conditions associated with the building and weather conditions. In some embodiments, as depicted, after operation 206 the method 200 may end.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of portion independence in that the consumer generally has no control or knowledge over the exact portion of the provided resources but may be able to specify portion at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 3A:
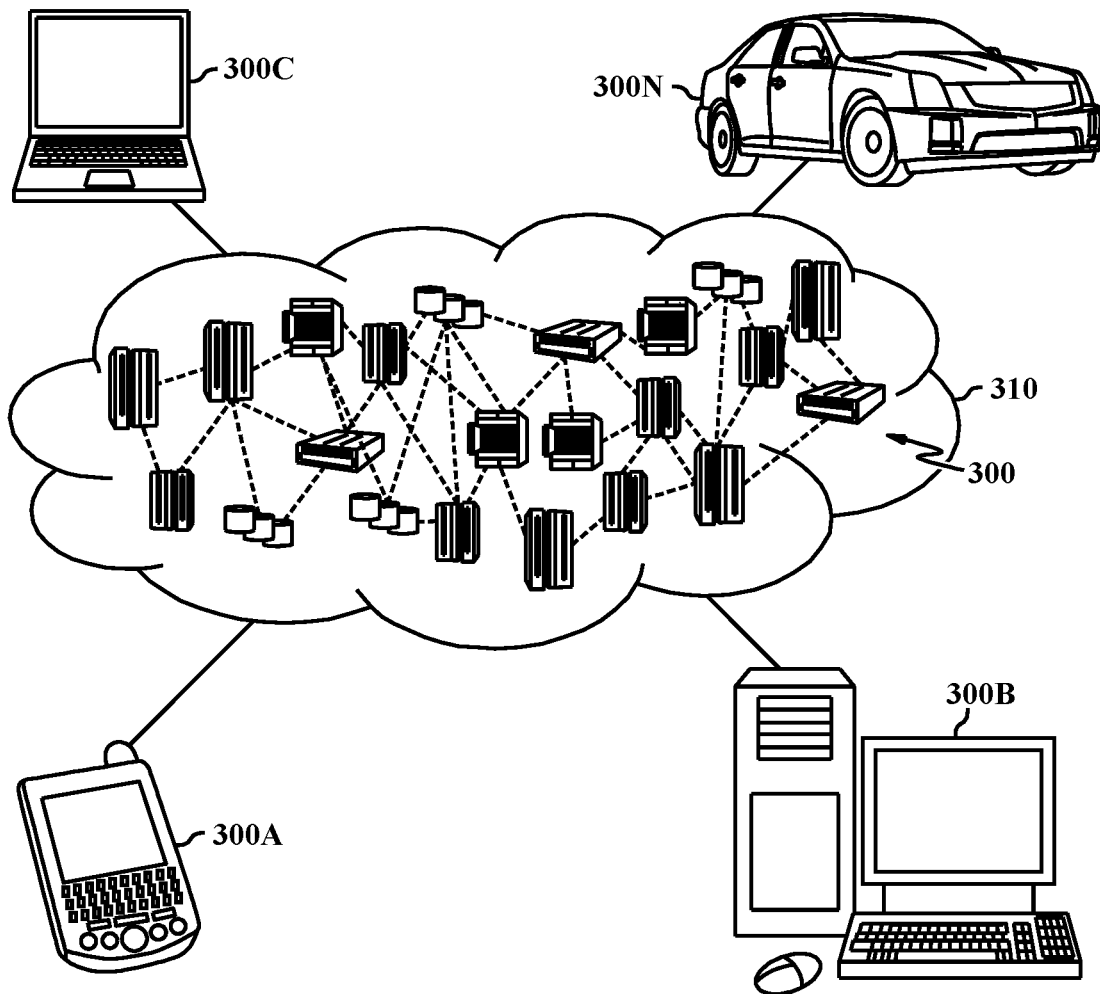
FIG. 3A illustrates a cloud computing environment, in accordance with embodiments of the present disclosure.

Referring now to FIG. 3A, illustrative cloud computing environment 310 is depicted. As shown, cloud computing environment 310 includes one or more cloud computing nodes 300 with which local computing devices used by cloud consumers, such as, for example, personal digital assistant (PDA) or cellular telephone 300A, desktop computer 300B, laptop computer 300C, and/or automobile computer system 300N may communicate. Nodes 300 may communicate with one another. They may be grouped (not shown) physically or virtually, in one or more networks, such as Private, Community, Public, or Hybrid clouds as described hereinabove, or a combination thereof. This allows cloud computing environment 310 to offer infrastructure, platforms and/or software as services for which a cloud consumer does not need to maintain resources on a local computing device. It is understood that the types of computing devices 300A-N shown in FIG. 3A are intended to be illustrative only and that computing nodes 300 and cloud computing 300 and cloud computing environment 310 can communicate with any type of computerized device over any type of network and/or network addressable connection (e.g., using a web browser).

Figure 3B:
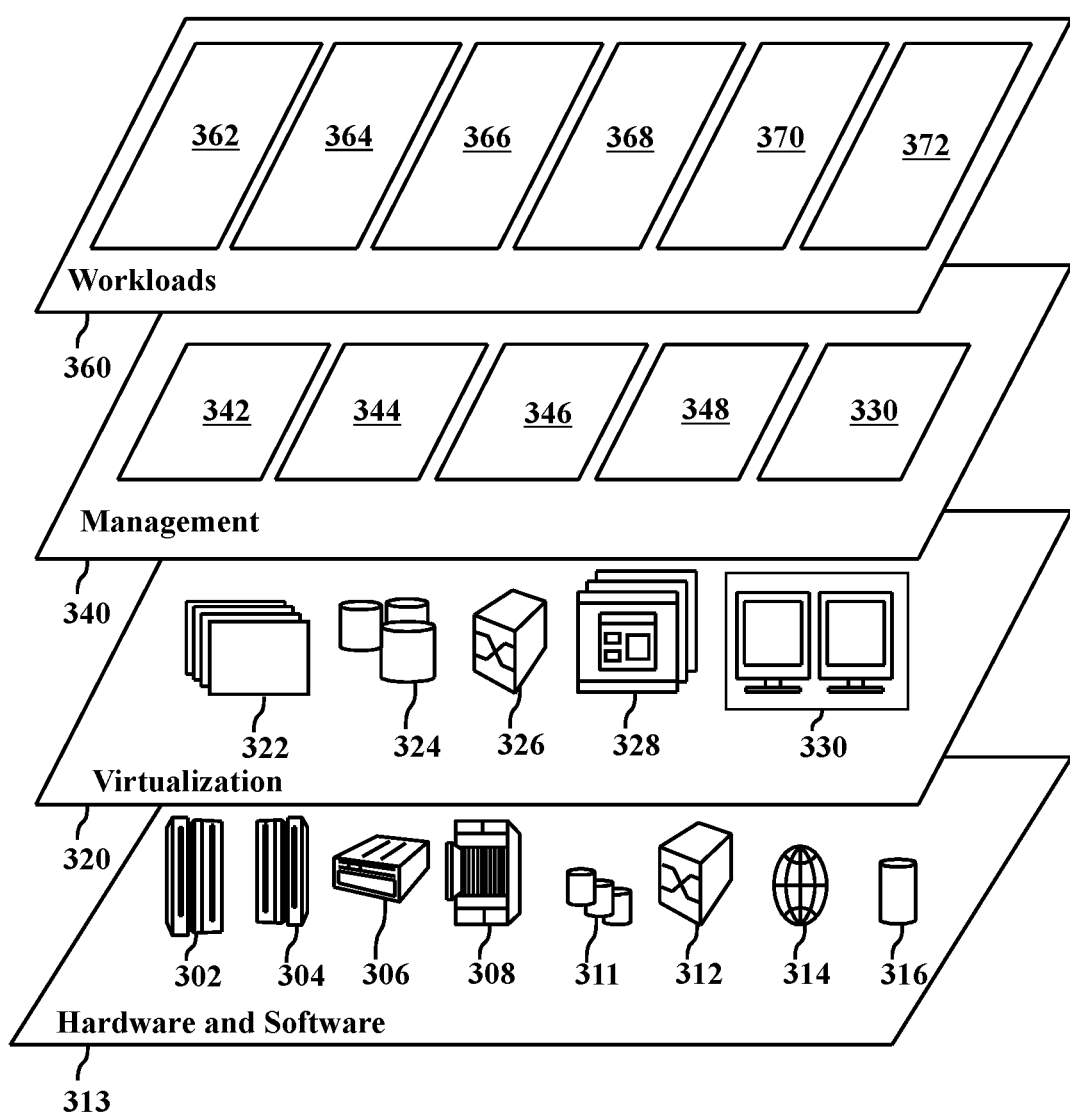
FIG. 3B illustrates abstraction model layers, in accordance with embodiments of the present disclosure.

Referring now to FIG. 3B, a set of functional abstraction layers provided by cloud computing environment 310 (FIG. 3A) is shown. It should be understood in advance that the components, layers, and functions shown in FIG. 3B are intended to be illustrative only and embodiments of the disclosure are not limited thereto. As depicted below, the following layers and corresponding functions are provided.

Hardware and software layer 315 includes hardware and software components. Examples of hardware components include: mainframes 302; RISC (Reduced Instruction Set Computer) architecture based servers 304; servers 306; blade servers 308; storage devices 311; and networks and networking components 312. In some embodiments, software components include network application server software 314 and database software 316.

Virtualization layer 320 provides an abstraction layer from which the following examples of virtual entities may be provided: virtual servers 322; virtual storage 324; virtual networks 326, including virtual private networks; virtual applications and operating systems 328; and virtual clients 330.

In one example, management layer 340 may provide the functions described below. Resource provisioning 342 provides dynamic procurement of computing resources and other resources that are utilized to perform tasks within the cloud computing environment. Metering and Pricing 344 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 346 provides access to the cloud computing environment for consumers and system administrators. Service level management 348 provides cloud computing resource allocation and management such that required service levels are met. Service Level Agreement (SLA) planning and fulfillment 350 provide pre-arrangement for, and procurement of, cloud computing resources for which a future requirement is anticipated in accordance with an SLA.

Workloads layer 360 provides examples of functionality for which the cloud computing environment may be utilized. Examples of workloads and functions which may be provided from this layer include: mapping and navigation 362; software development and lifecycle management 364; virtual classroom education delivery 366; data analytics processing 368; transaction processing 370; and proactive building managing 372.

Figure 4:
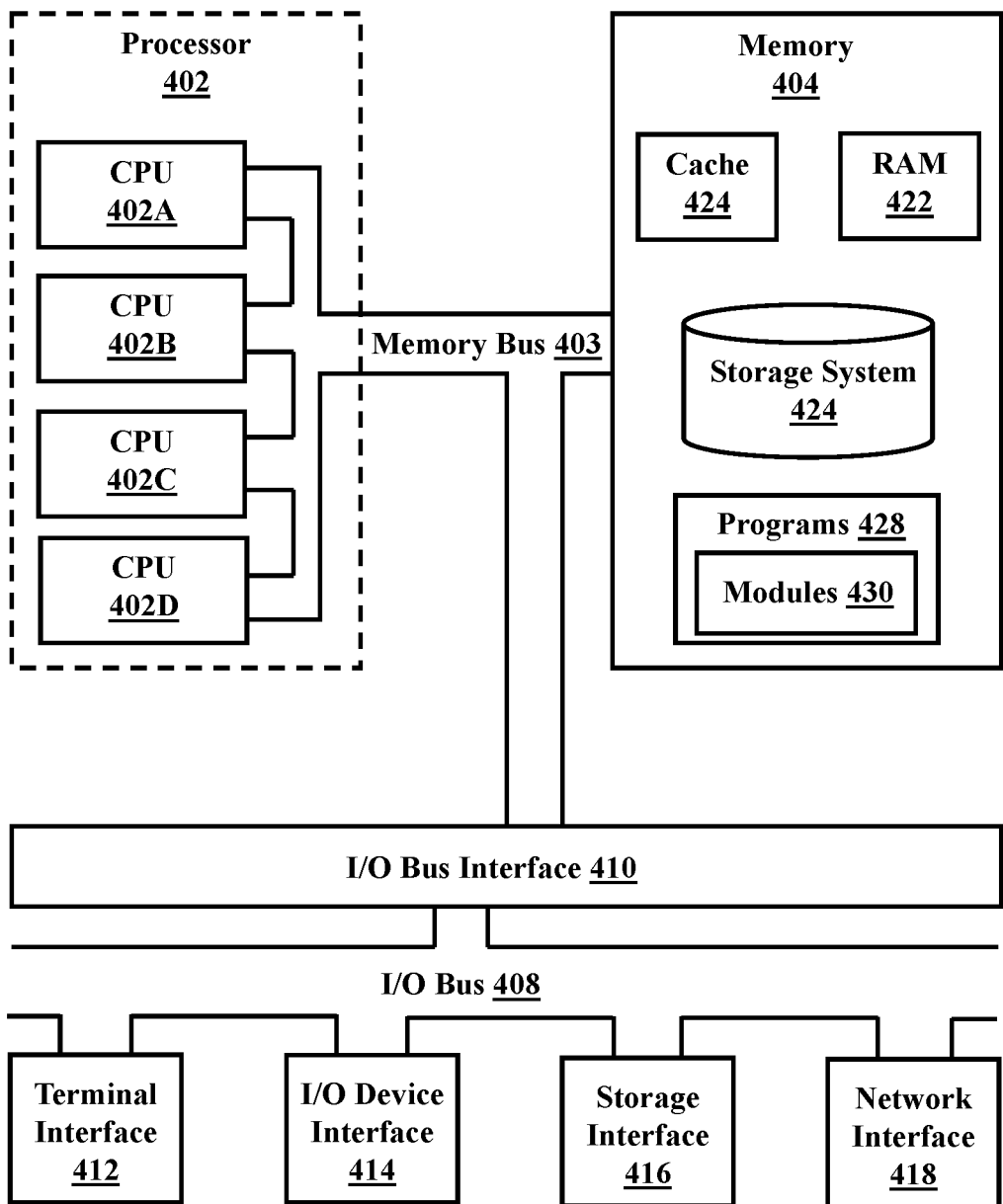
FIG. 4 illustrates a high-level block diagram of an example computer system that may be used in implementing one or more of the methods, tools, and modules, and any related functions, described herein, in accordance with embodiments of the present disclosure.

FIG. 4, illustrated is a high-level block diagram of an example computer system 401 that may be used in implementing one or more of the methods, tools, and modules, and any related functions, described herein (e.g., using one or more processor circuits or computer processors of the computer), in accordance with embodiments of the present invention. In some embodiments, the major components of the computer system 401 may comprise one or more Processor 402, a memory subsystem 404, a terminal interface 412, a storage interface 416, an I/O (Input/Output) device interface 414, and a network interface 418, all of which may be communicatively coupled, directly or indirectly, for inter-component communication via a memory bus 403, an I/O bus 408, and an I/O bus interface unit 410.

The computer system 401 may contain one or more general-purpose programmable central processing units (CPUs) 402A, 402B, 402C, and 402D, herein generically referred to as the CPU 402. In some embodiments, the computer system 401 may contain multiple processors typical of a relatively large system; however, in other embodiments the computer system 401 may alternatively be a single CPU system. Each CPU 402 may execute instructions stored in the memory subsystem 404 and may include one or more levels of on-board cache.

System memory 404 may include computer system readable media in the form of volatile memory, such as random access memory (RAM) 422 or cache memory 424. Computer system 401 may further include other removable/non-removable, volatile/non-volatile computer system storage media. By way of example only, storage system 426 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 404 can include flash memory, e.g., a flash memory stick drive or a flash drive. Memory devices can be connected to memory bus 403 by one or more data media interfaces. The memory 404 may include at least one program product having a set (e.g., at least one) of program modules that are configured to carry out the functions of various embodiments.

One or more programs/utilities 428, each having at least one set of program modules 430 may be stored in memory 404. The programs/utilities 428 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 428 and/or program modules 430 generally perform the functions or methodologies of various embodiments.

Although the memory bus 403 is shown in FIG. 4 as a single bus structure providing a direct communication path among the CPUs 402, the memory subsystem 404, and the I/O bus interface 410, the memory bus 403 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 410 and the I/O bus 408 are shown as single respective units, the computer system 401 may, in some embodiments, contain multiple I/O bus interface units 410, multiple I/O buses 408, or both. Further, while multiple I/O interface units are shown, which separate the I/O bus 408 from various communications paths running to the various I/O devices, in other embodiments some or all of the I/O devices may be connected directly to one or more system I/O buses.

In some embodiments, the computer system 401 may be a multi-user mainframe computer system, a single-user system, or a server computer or similar device that has little or no direct user interface, but receives requests from other computer systems (clients). Further, in some embodiments, the computer system 401 may be implemented as a desktop computer, portable computer, laptop or notebook computer, tablet computer, pocket computer, telephone, smartphone, network switches or routers, or any other appropriate type of electronic device.

It is noted that FIG. 4 is intended to depict the representative major components of an exemplary computer system 401. In some embodiments, however, individual components may have greater or lesser complexity than as represented in FIG. 4, components other than or in addition to those shown in FIG. 4 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A method for proactive building maintenance, the method comprising:
    receiving, by a processor, an input dataset, wherein the input dataset includes a plurality of construction components and one or more performance factors of the building;
    generating one or more simulations of the building using the input dataset to simulate an impact of one or more weather conditions on the building and a forecast having one or more predicted conditions associated with the building;
    identifying one or more preventable conditions and one or more unpreventable conditions from the one or more predicted conditions;
    altering a portion of the plurality of construction components, based on the the preventable conditions, prior to the impact of the one or more weather conditions, wherein altering the one or more construction components mitigates the preventable conditions; and
    generating a predicted evacuation plan for one or more users based on the unpreventable conditions associated the one or more weather conditions.

2. The method of claim 1, wherein the input dataset is received from a real-time data feed connected to one or more of the plurality of construction components and is configured to identify the one or more performance factors.

3. The method of claim 1, further comprising:
    configuring an historical repository of the one or more performance factors, and the plurality of construction components, based on an historical dataset.

4. The method of 3, wherein simulating the impact of one or more weather conditions on the building, further comprises:
    analyzing the historical repository to identify the forecast.

5. The method of claim 1, wherein the input dataset further includes:
    one or more user datasets, wherein the one or more user datasets includes profiles associated with users of the building.

6. The method of claim 1, wherein the forecast having the one or more predicted conditions associated with the building further includes a building maintenance plan, wherein the building maintenance plan includes one or more mitigating recommendations associated with the one or more weather conditions.

7. A system for proactive building maintenance, the system comprising:
    a memory; and
    a processor in communication with the memory, the processor being configured to perform operations comprising:
        receiving an input dataset, wherein the input dataset includes a plurality of construction components and one or more performance factors of the building;
        generating one or more simulations of the building using the input dataset to simulate an impact of one or more weather conditions on the building and a forecast having one or more predicted conditions associated with the building;
        identifying one or more preventable conditions and one or more unpreventable conditions from the one or more predicted conditions;
        altering a portion of the plurality of construction components based on the preventable conditions prior to the impact of the one or more weather conditions, wherein altering the one or more construction components mitigates the preventable conditions; and
        generating a predicted evacuation plan for one or more users based on the unpreventable conditions associated the one or more weather conditions.

8. The system of claim 7, wherein the input dataset is received from a real-time data feed connected to one or more of the plurality of construction components and is configured to identify the one or more performance factors.

9. The system of claim 7, further comprising:

configuring an historical repository of the one or more performance factors, and the plurality of construction components, based on an historical dataset.

10. The system of 9, wherein simulating the impact of one or more weather conditions on the building, further comprises:
analyzing the historical repository to identify the forecast.

11. The system of claim 7, wherein the input dataset further includes:
one or more user datasets, wherein the one or more user datasets includes profiles associated with users of the building.

12. The system of claim 7, wherein the forecast having the one or more predicted conditions associated with the building further includes a building maintenance plan, wherein the building maintenance plan includes one or more mitigating recommendations associated with the one or more weather conditions.

13. A computer program product for removing an anomaly in a collection of material, the computer program product comprising a computer readable storage medium having program instructions embodied therewith, the program instructions executable by a processor to cause the processors to perform a function, the function comprising:
receiving, by a processor, an input dataset, wherein the input dataset includes a plurality of construction components and one or more performance factors of the building;
generating one or more simulations of the building using the input dataset to simulate an impact of one or more weather conditions on the building and a forecast having one or more predicted conditions associated with the building;
identifying one or more preventable conditions and one or more unpreventable conditions from the one or more predicted conditions;
altering a portion of the plurality of construction components based on the preventable conditions prior to the impact of the one or more weather conditions, wherein altering the one or more construction components mitigates the preventable conditions; and
generating a predicted evacuation plan for one or more users based on the unpreventable conditions associated the one or more weather conditions.

14. The computer program product of claim 13, wherein the input dataset is received from a real-time data feed connected to one or more of the plurality of construction components and is configured to identify the one or more performance factors.

15. The computer program product of claim 13, further comprising:
configuring an historical repository of the one or more performance factors, and the plurality of construction components, based on an historical dataset.

16. The computer program product of 17, wherein simulating the impact of one or more weather conditions on the building, further comprises:
analyzing the historical repository to identify the forecast.

17. The computer program product of claim 13, wherein the input dataset further includes:
one or more user datasets, wherein the one or more user datasets includes profiles associated with users of the building.

* * * * *